US006075705A

United States Patent [19]
Nakamura et al.

[11] Patent Number: 6,075,705
[45] Date of Patent: Jun. 13, 2000

[54] I/O CARD HAVING CABLE CONNECTOR SOCKET WITHOUT METALLIC SHELL

[75] Inventors: Keisuke Nakamura; Kayoko Gotou, both of Akishima, Japan

[73] Assignee: Japan Aviation Electronics Industry, Limited, Tokyo, Japan

[21] Appl. No.: 09/232,926

[22] Filed: Jan. 19, 1999

[30] Foreign Application Priority Data

Jan. 20, 1998 [JP] Japan .................................. 10-009102

[51] Int. Cl.[7] .............................. H05K 1/14; H05K 1/07
[52] U.S. Cl. ........................ 361/737; 361/736; 361/750; 361/800; 361/814; 361/816; 361/753; 235/492; 439/946
[58] Field of Search ..................................... 361/737, 736, 361/750, 753, 800, 814, 816; 235/441, 487, 492; 257/679; 439/946, 629

[56] References Cited

U.S. PATENT DOCUMENTS

3,894,784  7/1975  Clewes ..................................... 361/737
5,409,385  4/1995  Tan et al. ................................... 439/76
5,627,729  5/1997  Oldendorf et al. ...................... 361/737

*Primary Examiner*—Leo P. Picard
*Assistant Examiner*—Hung Van Duong
*Attorney, Agent, or Firm*—Laff, Whitesel & Saret, Ltd.; J. Warren Whitesel

[57] ABSTRACT

In an I/O card has a case having metallic top and bottom covers, a printed circuit board mounted in the case, a connector disposed in the case for connecting with a personal computer system, and a card side I/O connector disposed in the case for mating with a cable side I/O connector connected to external device, the card side I/O connector is provided with no shell but is in direct contact with the metallic top and bottom covers, so that the both covers came in direct contact with a metallic shell of the cable side I/O connector when the cable side I/O connector is mated with the card side I/O connector. In an embodiment, the top cover is provided with locking pieces which engages with elastic locks of the cable side I/O connector for locking a mating condition between the card side I/O connector and the cable side I/O connector.

6 Claims, 11 Drawing Sheets

I/O CARD HAVING CABLE CONNECTOR SOCKET WITHOUT METALLIC SHELL

BACKGROUND OF THE INVENTION

The present invention relates to an I/O card for use in a data processing apparatus such as a notebook type personal computer, a personal digital assistant (PDA), or the like, and in particular, to a shielding structure of a cable connector socket in such an I/O card.

Generally, the data processing apparatus is provided with a card connector and can selectively be connected with a selected one of external devices through an I/O card therefor received in the card connector.

A known I/O card generally comprises a case, a printed circuit board mounted in the case, and a fitting connector connected to the printed circuit board and having a fitting portion exposed out of the case for connecting with the card connector. The fitting connector is generally referred to as a system fitting connector because it is fitted to the card connector in the data processing apparatus or system. The I/O card further Includes a cable connector socket connected to the printed circuit board and having a mating portion for mating with a cable connector plug. In detail, the case comprises a rectangular frame of an insulator and a pair of cover plates of metal such as stainless steel attached onto both sides of the frame, respectively, to form an inner space in the rectangular frame and between the cover plates. The printed circuit board is disposed in the inner space. The system fitting connector and the cable connector socket are mounted in opposite sides of the frame.

The cable connector plug is mounted on one end of a cable which has the apposite end connected with an external device and is mated with the cable connector socket of the I/O card in order to connect the external device to the I/O card. The cable connector socket and plug are generally referred to as a cable side I/O connector and a card side I/O connector.

In a condition when the I/O card is loaded in the card connector of the data processing apparatus and when the cable connector plug or the cable side I/O connector is mated with the cable connector socket of the I/O card or the card side I/O connector, the data processing apparatus is connected with the external device and can take in and send out data from and to the external device.

In order to avoid the data transferring between the data processing apparatus and the external device from being interfered by external electromagnetic noise, the cable is provided with a shielding jacket layer and the cable side and card side connectors are provided with metallic shells.

According the PC card standards by the Compact Flash Association (CFA), the I/O card is determined to have a specific thickness. It is difficult, however, to manufacture a thin I/O card having the protection against electromagnetic interference (EMI) while meeting the standards. Specifically, the use of the metallic shell for the card side I/O connector results in difficulty of production of such a thin X/O card and leads to an increased cost because of a complicated process in assembling the shell to the card side I/O connector.

Further, in order to lock the connection between the cable side I/O connector and the card side I/O connector, the cable side I/O connector has elastic locking keys projecting from its shell. The cable side I/O connector is formed with locking holes in its shell for engaging the locking keys when the cable side I/O connector is mated with the card side I/O connector. This makes a structure of the I/O card complicated.

SUMMARY OF THE INVENTION

It is an object of the present invention to provide an I/O card having a provision against EMI which is small in thickness, simple in structure and low in cost. The present invention is applicable to an I/O card which comprises a case comprising a frame and a metallic top and bottom covers mounted on top and bottom surfaces of the frame to define an inner space; and a card side I/O connector mounted in the inner space of the case and having a fitting portion exposed outside of the case for being selectively mated with a cable side I/O connector as a mating connector. According to the present invention, the card side I/O connector comprises: an insulator having an upper and lower surfaces and a front surface and having the fitting portion projecting from the front surface, the insulator being fixedly disposed in the case, the upper and lower surfaces being in directly contact with the metallic top and bottom covers, respectively, the fitting portion facing the metallic top and bottom covers with spaces left therebetween; and a plurality of contacts having contact portions and fixed in the insulator, the contact portions being supported on a side of the fitting portion and facing one of the top and bottom covers with a space therebetween.

Preferably, the I/O card as claimed in claim 1 further comprises a printed circuit board fixedly mounted in the inner space of the case, the I/O connector is fixed and connected to the printed circuit board and a system fitting connector disposed in the housing and exposed in a direction opposite to the card side I/O connector, the system fitting connector being fixed and connected to the printed circuit board.

When the cable side I/O connector has an outer metallic shell, each of the top and bottom covers preferably has an elastic contact piece extending in the spaces between the fitting portion and the top and bottom covers for coming into contact with the shell of the cable side I/O connector when the cable side I/O connector mated with the card side I/O connector.

In a preferred embodiment, the frame is formed integrally with one of the two covers.

When the cable side I/O connector has a pair of elastic locks, one of the top and bottom covers is preferably provided with a pair of lock pieces for engaging with the elastic looks, respectively, to lock the cable side I/O connector to the I/O card when the cable side I/O connector is mated with the card side I/O connector.

DESCRIPTION OF THE PREFERRED EMBODIMENTS

Prior to description of preferred embodiments of the present invention, a known I/O card will be described with reference to FIG. 1 through FIG. 4 for facilitating the better understanding of the present invention.

Figure 1:
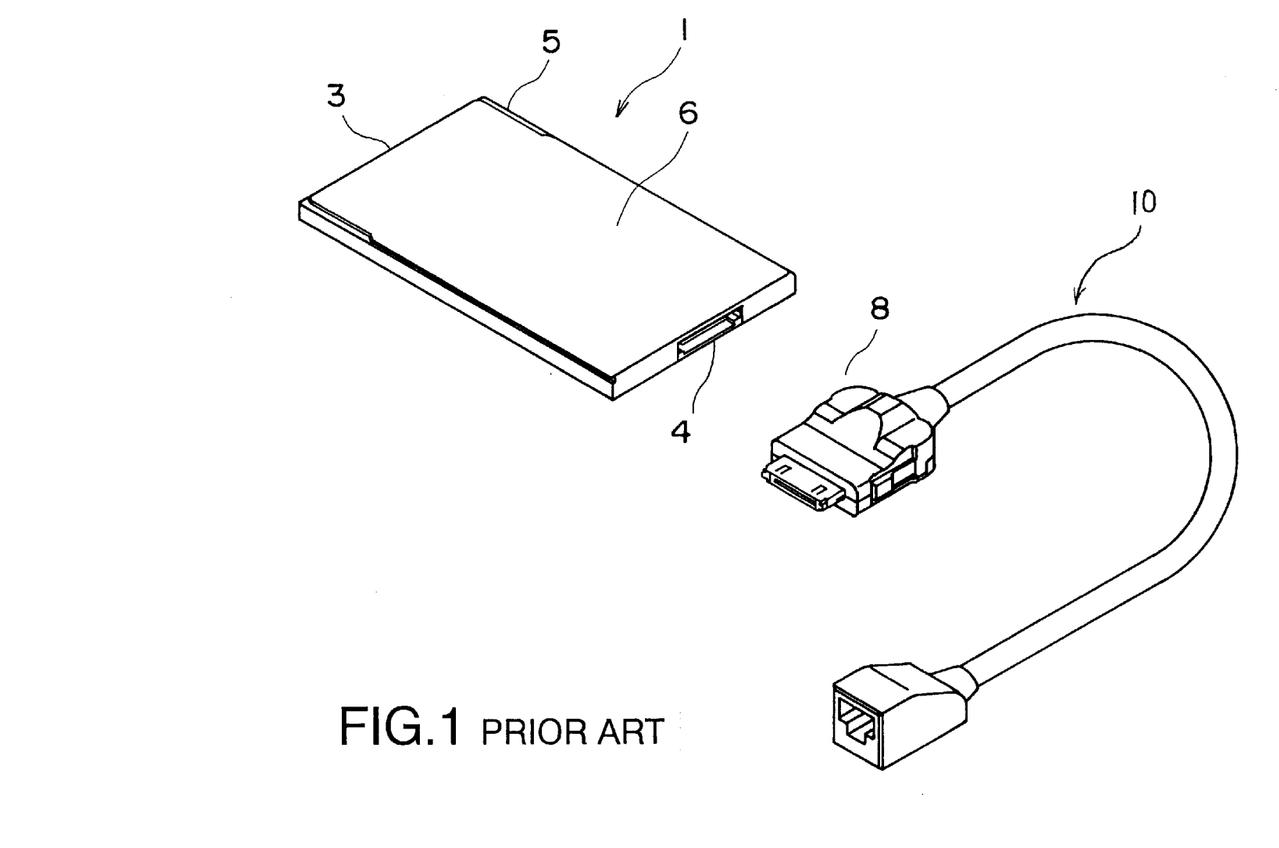
FIG. 1 is a perspective view of an I/O card together with a cable for connecting the I/O card with an external device.

Referring to FIG. 1, an I/O card 1 generally has a system fitting connector 3 and a card side I/O connector 4. The system fitting connector 3 is connected with a card connector (not shown) when the I/O card 1 is loaded in the card connector in, for example, a personal computer (not shown). The card side I/O connector 4 is mated with a cable side I/O connector 8 mounted on an end of a cable of a cable unit 10 which is connected at the opposite end to an any desired external device.

In FIG. 1, there are shown a frame 5 and a top cover 6 both of which form a case of the I/O card 1 together with a bottom plate (not shown).

Figure 2:
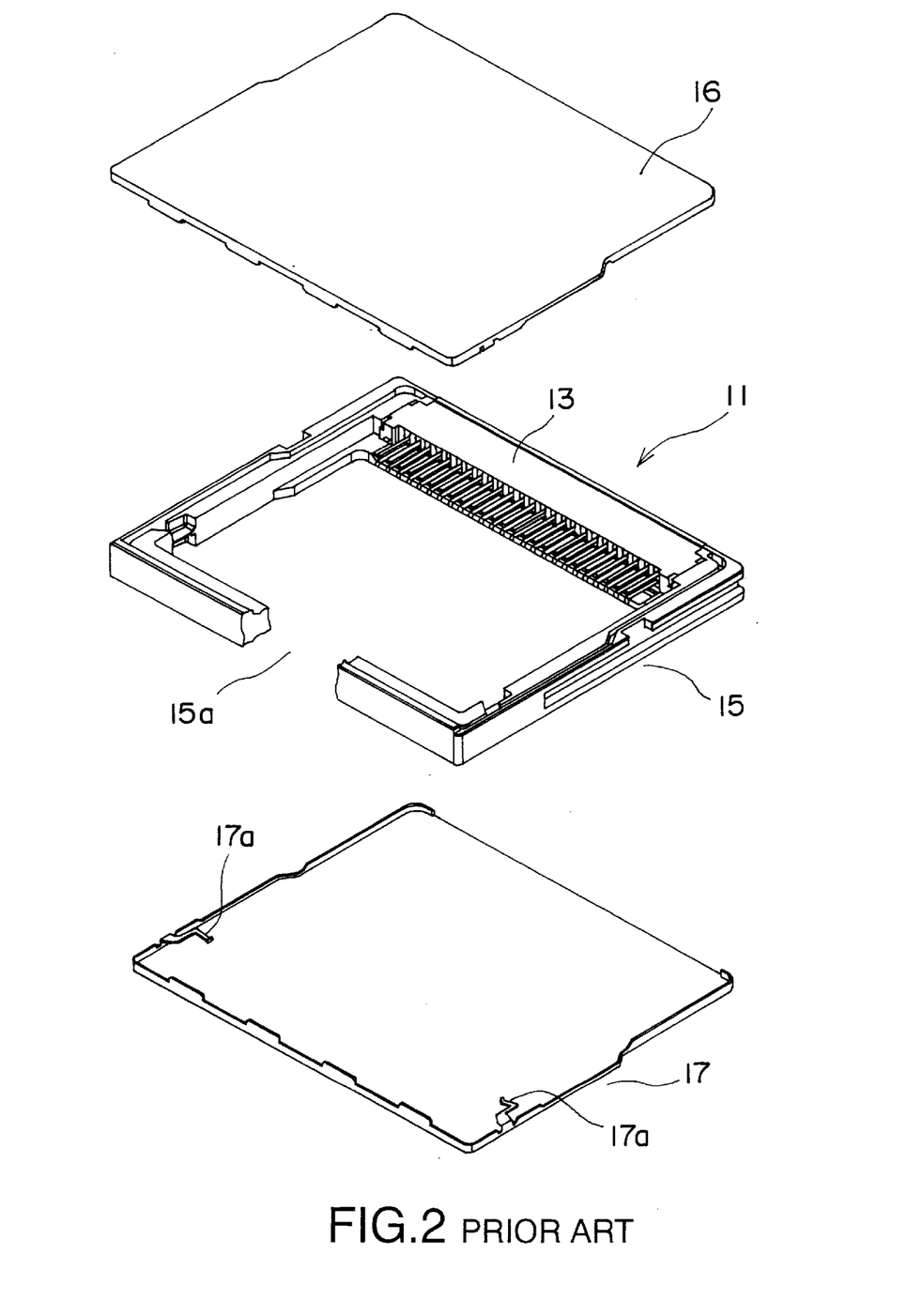
FIG. 2 is an exploded perspective view of a known I/O card, with a card side I/O connector omitted.
Figure 3:
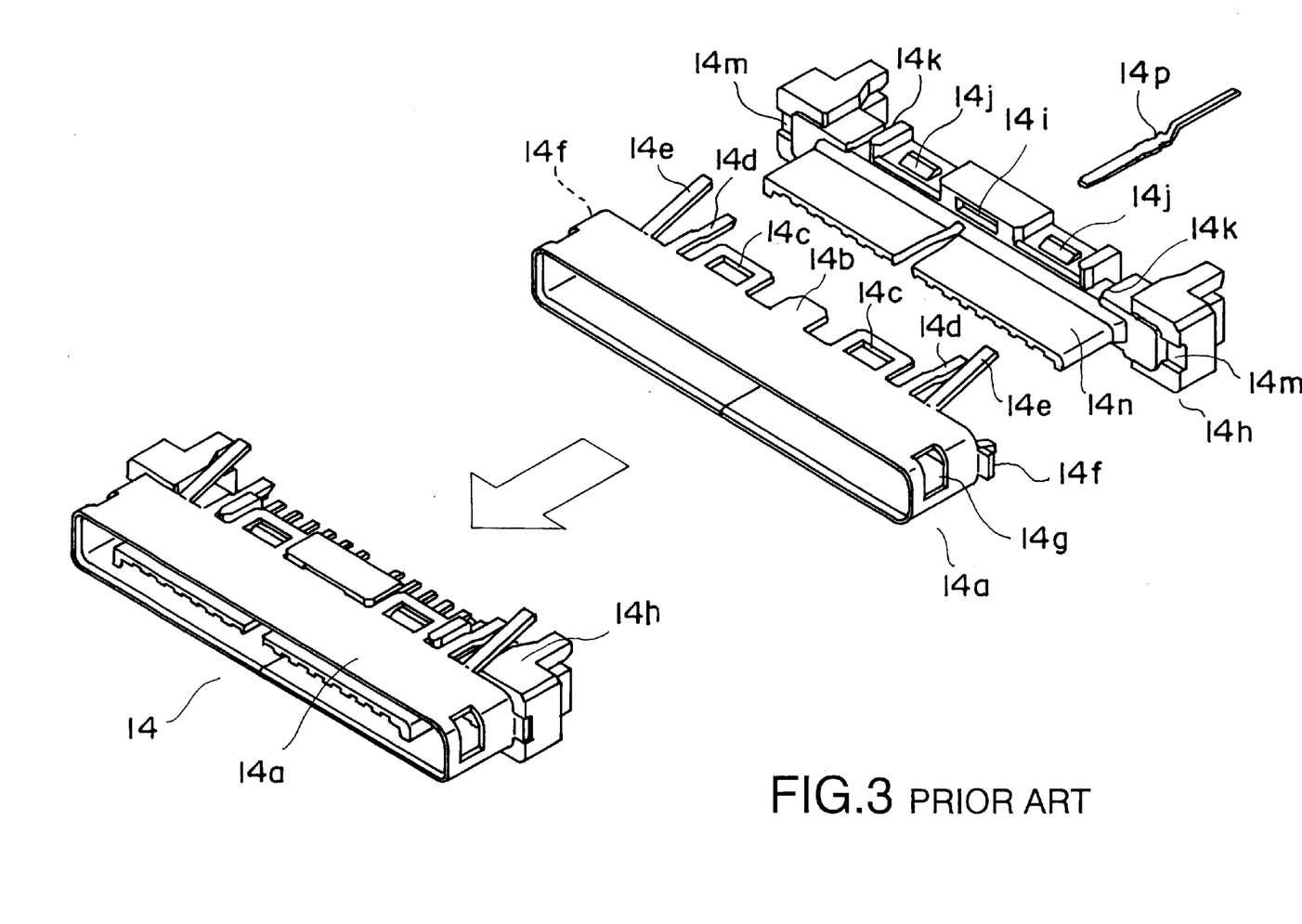
FIG. 3 is an exploded perspective view of the card side I/O connector in the known I/O card.

Referring to FIGS. 2–4B, a known one of the I/O Card shown at 11 in the figure has a case comprising a frame 15, a metallic top and bottom covers 16 and 17 as shown in FIG. 2. The frame 15 is a rectangular frame of plastic resin with one side thereof having a system fitting connector 11, while the opposite side thereof having an opening 15a. In the opening, a card side I/O connector 14 of FIG. 3 is mounted. A printed circuit board 12 (FIG. 4B) is disposed in the case and connected to the system fitting connector 13 and the card side I/O connector 14. The bottom cover 17 is formed with springs 17a. When the I/O card is assembled, the springs 17a come into contact with the bottom side of the printed circuit board 12.

As shown in FIG. 3, the card side I/O connector 14 comprises a frame-shaped metallic shell 14a, a block-shaped insulator 14h, and a plurality of contacts 14p secured to the insulator 14h in a row at fixed intervals.

The shell 14a has a locking finger section 14b protruding from the center of one side of its upper wall portion, loop-shaped lock sections 14c and 14c protruding from both sides of the locking finger section 14b, two pairs of elastic retaining pieces 14d and 14e being disposed adjacent to the loop-shaped lock sections 14c and 14c, respectively, locking tabs 14f and 14f protruding from opposite ends of the shell, and locking holes 14g and 14g in the apposite end walls of the shell.

The insulator 14h has a concave look section 14i at the center of an upper surface thereof, lock key sections 14j and 14j at both sides of the concave lock section 14i, stepped sections 14k and 14k disposed adjacent to the lock key sections 14j and 14j, and groove-shaped lock sections 14m and 14m in the front surface at opposite end portions thereof. A fitting section 14n protrudes from the front surface of the insulator 14h and supports contact portions of one ends of the contacts 14p. The other ends of the contacts 14p are connected and fixed to the printed circuit board 12.

In FIG. 3, the locking finger section 14b, the loop-shaped lock sections 14c, 14c, the elastic retaining pieces 14d and 14e, and the locking tabs 14f of the shell 14a are engaged with the concave look section 14i, the protruding lock key sections 14j, the stepped sections 14k, 14k, and the groove-shaped lock sections 14m of the insulator 14h, respectively, by assembling the insulator 14h into the shell 14a. Thus, the card side I/O connector 14 is performed as shown at frontward an arrow in FIG. 3. The card side I/O connector 14 assembled is mounted into the opening 15a of the frame 15.

Figure 4A:
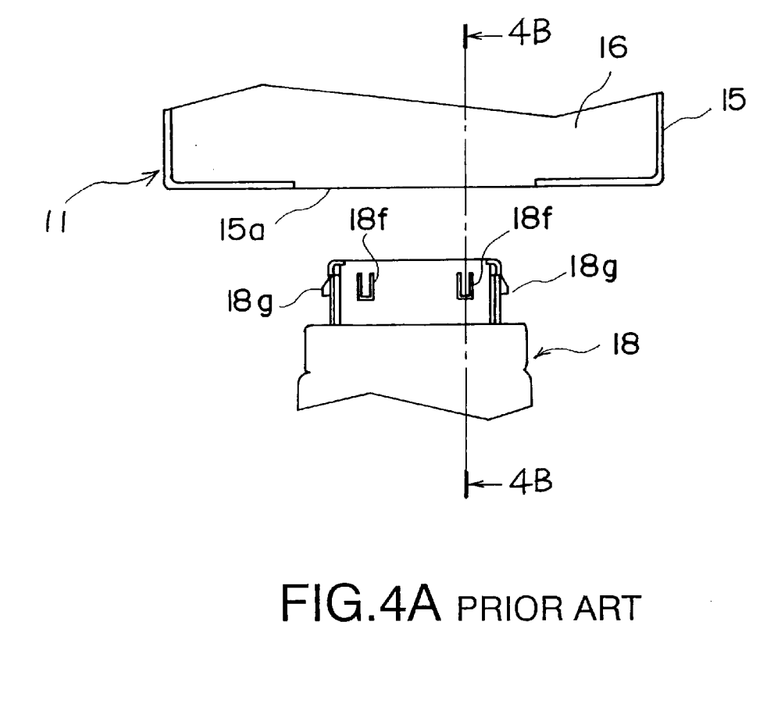
FIG. 4A is a bottom view illustrating a condition just before connecting the known I/O card with the cable side I/O connector, where a bottom cover and a card side I/O connector are omitted.
Figure 4B:
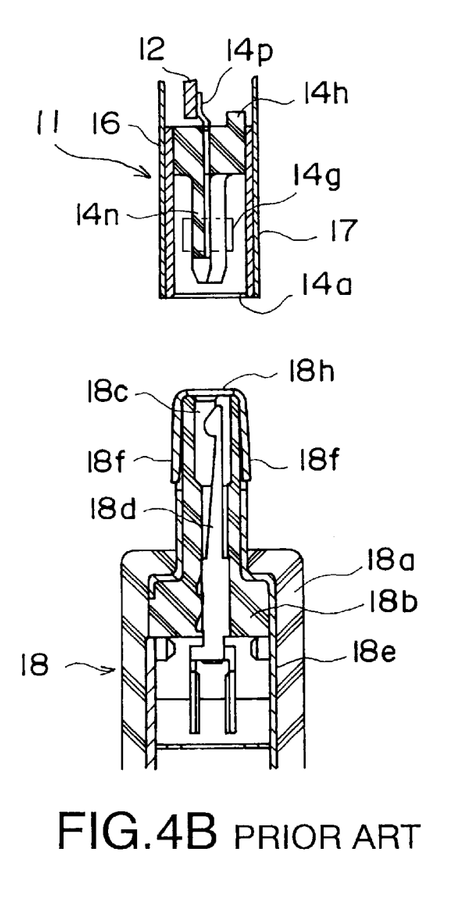
FIG. 4B is a sectional view at line 4B—4B in FIG. 4A, but the bottom cover and the card side I/O connector being shown as assembled.

As shown in FIG. 4, the cable side I/O connector 18 includes an outer frame 18a made of a synthetic resin, an insulator 18b housed in the frame 18a, a plurality of contacts 18d secured to the insulator 18b, and a metallic shell 18e covering the insulator 18b as well as contacts 18d.

The contacts 18d are secured in a row at regular intervals in the insulator 18b. The distal ends of the contacts 18d are positioned in a space 18c of the insulator 18b.

Two pairs of elastic contact pieces 18f are formed on both top and bottom surfaces of the shell 18e, respectively, by cutting and erecting work. Two elastic locking keys 18g are formed on opposite and surfaces of the shell 18e by the cutting and erecting work, and a hole 18h is opened at the distal end of the shell 18e for receiving contacts 14p of the card side I/O connector 14 when mated therewith.

Mating the cable side I/O connector 18 with the card side I/O connector 14 causes the fitting section 14n and the contacts 14p of the insulator 14h to be inserted in the space 18c of the insulator 18b thee bringing the distal ends of the contacts 14p into contact with the distal ends of the contacts 18d. At this t the four elastic contact pieces 18f of the shell 18e come in contact with the shell 14a, and the two elastic lock keys 18g of the shell 18e are retained in the two looking holes 14g of the shell 14a, respectively.

The cable side I/O connector 18 is separated from the card side I/O connector 14 as follows. By using a hood which is made of a synthetic resin and which is not shown, the two elastic lock keys 18g of the shell 18e are pushed out of two looking holes 14g of the shell 14a, then the cable side I/O connector 18 is pulled off from the card side I/O connector 14.

The known I/O card has problems described in the preamble.

An embodiment of the present invention and an example obtained by modifying the embodiment will be described by referring to FIG. 5A through FIG. 11B.

The I/O card according to the embodiment is similar to the known I/O card but is not provided with the metallic shell of the card side I/O connector. Therefore, the insulator of the card side I/O connector is not required to have a complicated outer structure for locking or fixing the metallic shell which the known one has as shown in FIG. 3 and is, therefore, very simple in the configuration, for example, in a rectangular shape having four outer side surfaces, a rear surface and a front surface. On the front surface, a fitting portion protects.

Figure 5A:
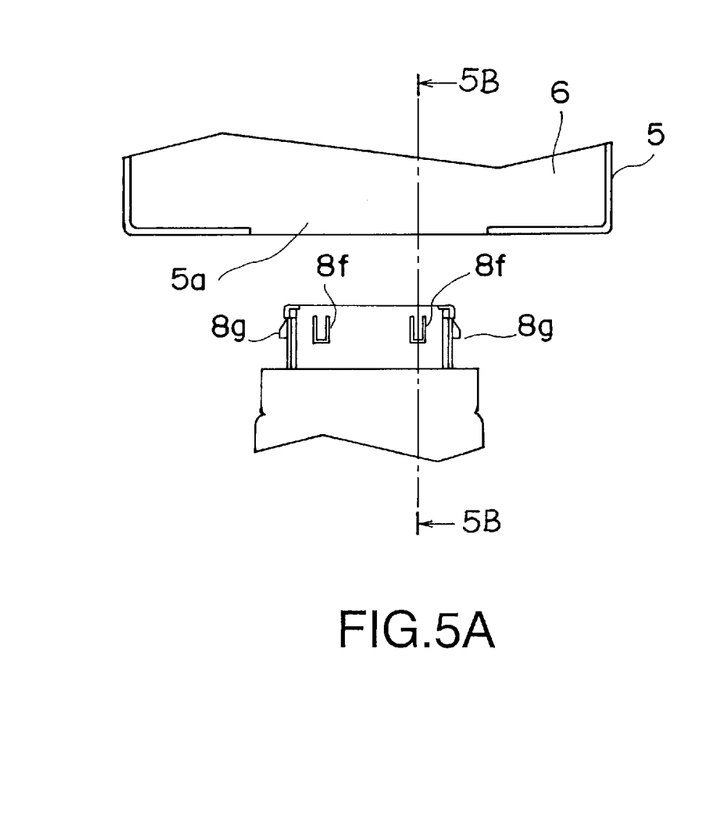
FIG. 5A is a bottom view illustrating a condition just before connecting an I/O card according to one embodiment of the present invention with the cable side I/O connector, where a bottom cover and a card side I/O connector are omitted.
Figure 5B:
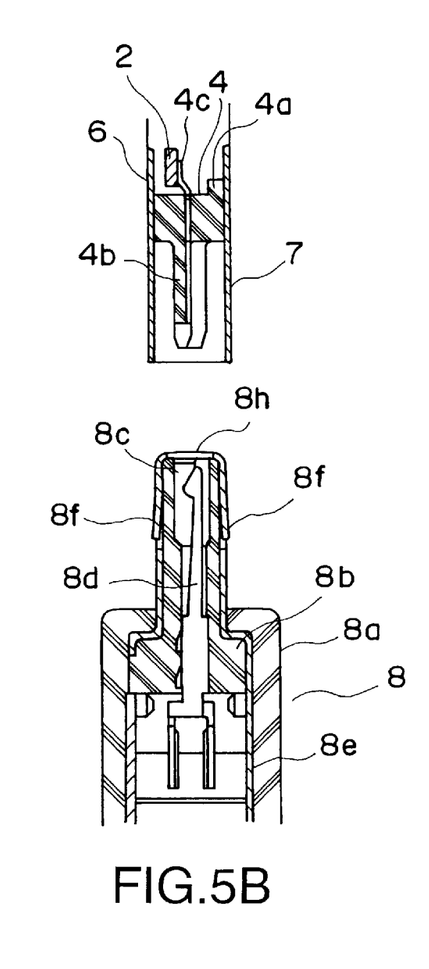
FIG. 5B is a sectional view at line 5B—5B in FIG. 5A, but the bottom cover and the card side I/O connector being shown as assembled.

Referring to FIGS. 5A and 5B, the I/O card 1 according to the embodiment also has a printed circuit board 2 on which electronic components are mounted, a frame 5, and the card side I/O connector 4, a metallic top cover 6, and a metallic bottom cover 7. The frame 5 is a rectangular frame and is formed with an opening 5a in one side thereof in which opening the card side I/O connector 4 without shell is mounted. A system fitting connector is also mounted in the apposite side of the rectangular frame but is not shown.

The frame 5 is made of a synthetic resin and provides the skeleton of the entire I/O card. The frame 5 may be made using metal or by a synthetic resin covered with an outer plating layer. A cable side I/O connector 8 engages with the card side I/O connector 4.

The card side I/O connector 4 includes a simple block-shaped insulator 4a and a plurality of contacts 4c. The contacts 4c are secured to the insulator 4a in a row at regular intervals. One and of each of the contacts 4c is in contact with the printed circuit board 2, while the other end of each of the contacts 4c is supported by a fitting section 4b of the insulator 4a. As described above, the insulator 4a is very simple because it is not required to have a structure for fixing any metallic shell.

As shown in FIGS. 5A and 5B, the cable side I/O connector 8 includes a frame 8a that provides the skeleton of the entire connector and that is made of a synthetic resin, an insulator 8b housed in the frame 8a, many contacts 8d secured to the insulator 8b, and a shell 8e that covers the many contacts 8d and the insulator 8b.

Inside the insulator 8b, many contacts 8d are secured in a row at regular intervals, and the distal ends of the many contacts 8d are positioned in a space 8c of the insulator 8b.

Elastic contact pieces 8f and 8f are formed, two each, on both top and both surfaces of the shell 8e by cutting and erecting work. Elastic locks 8g are formed on both side surfaces of the shell 8e by the cutting and erecting work, and a hole 8h is opened at the distal end of the shell 8e.

Figure 6A:
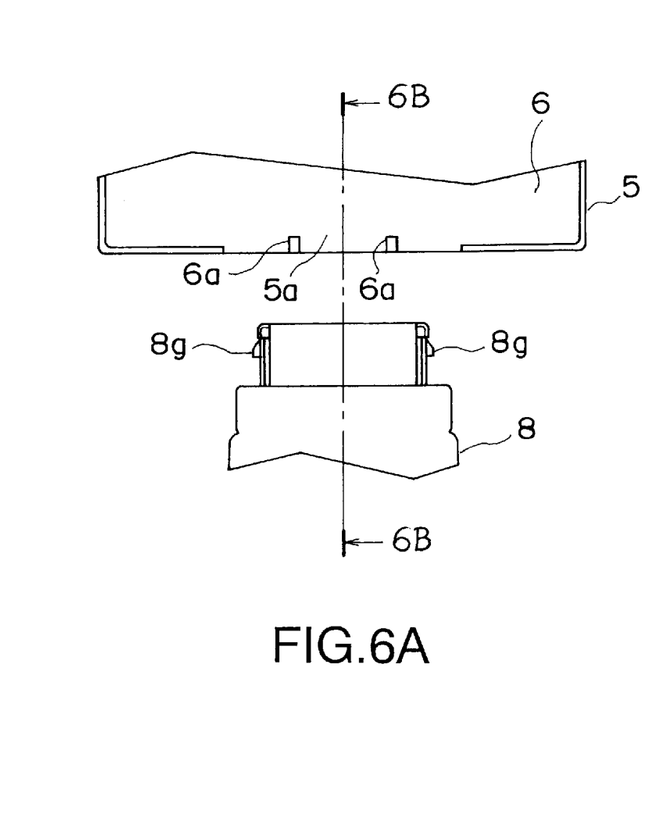
FIG. 6A is a bottom view illustrating a condition just before connecting an I/O card according to a modification of the embodiment with the cable side I/O connector, where a bottom cover and a card side I/O connector are omitted.
Figure 6B:
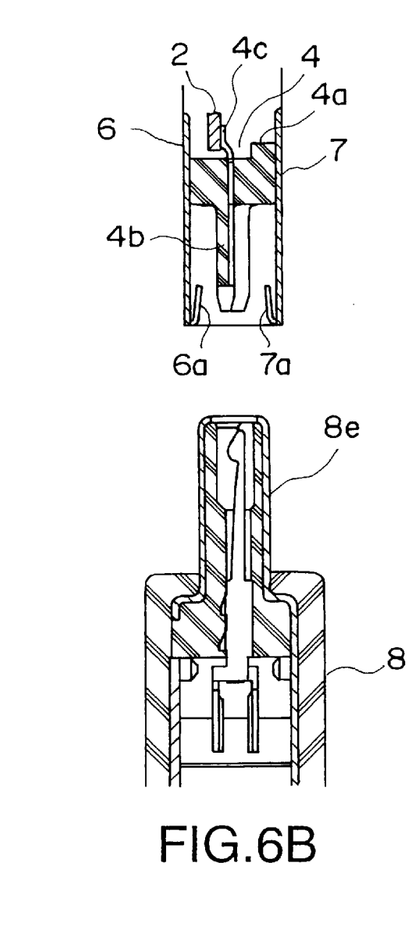
FIG. 6B is a sectional view at line 6B—6B in FIG. 6A, but the bottom cover and the card side I/O connector being shown as assembled.
Figures 7A, 7C:
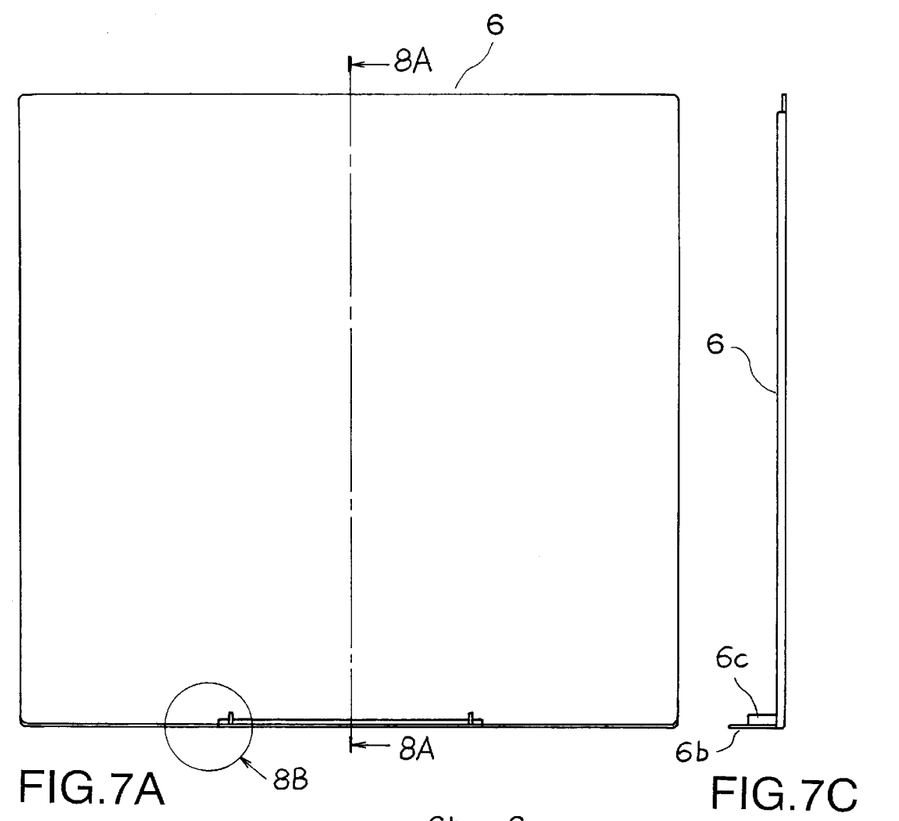
FIG. 7A is a bottom view of a top cover in the I/O card of the embodiment in accordance with the present invention.
FIG. 7C is a side view of the top cover of FIG. 7A.
Figure 7B:
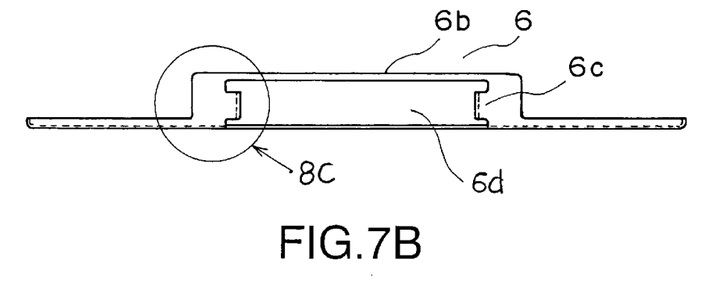
FIG. 7B is a view of the top cover of FIG. 7A as seen from a bottom side on FIG. 7A.
Figure 8A:
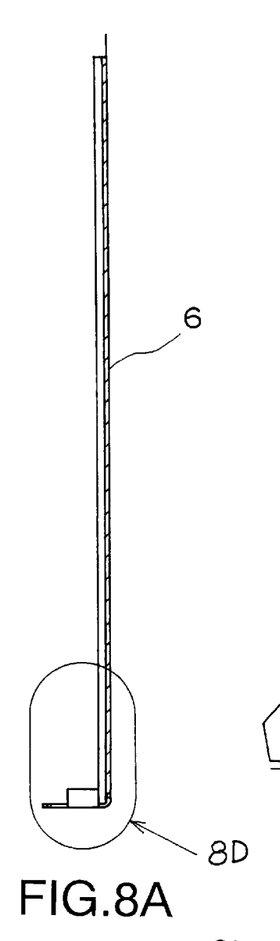
FIG. 8A a sectional view at line 8A—8A in FIG. 7A.
Figure 8B:
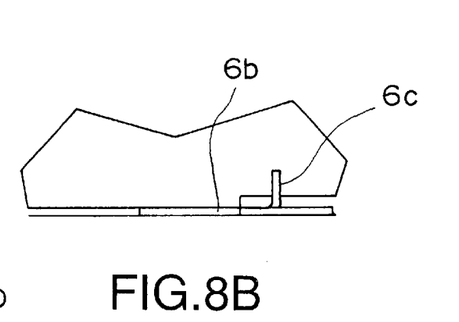
FIG. 8B is an enlarged view of a portion encircled at 8B in FIG. 7A.
Figure 8C:
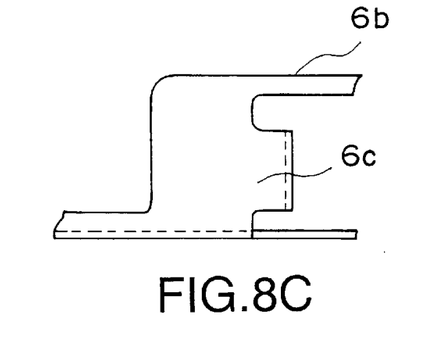
FIG. 8C is an enlarged view of a portion encircled at 8C in FIG. 7B.
Figure 8D:
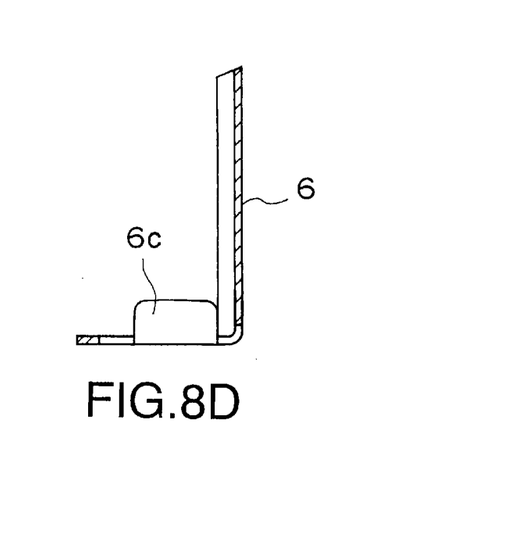
FIG. 8D is an enlarged view of a portion encircled at 8D in FIG. 8A.
Figure 9A:
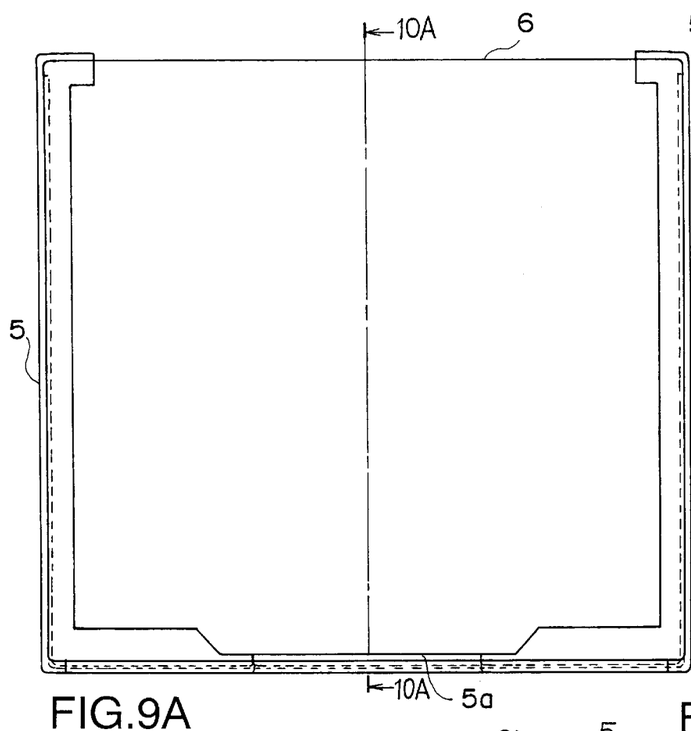
FIG. 9A is a bottom view of an assembly of the top cover and the frame in the I/O card of the embodiment in accordance with the present invention.
Figure 9B:
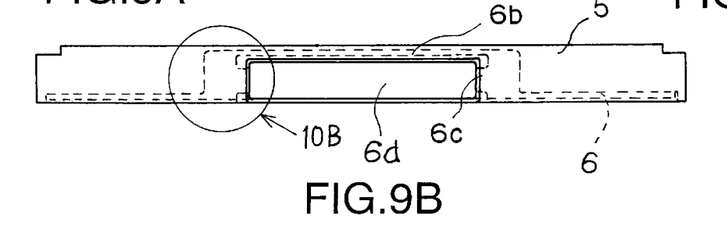
FIG. 9B is a view of the assembly of the top cover and the frame as seen from the bottom side on FIG. 9A.
Figure 9C:
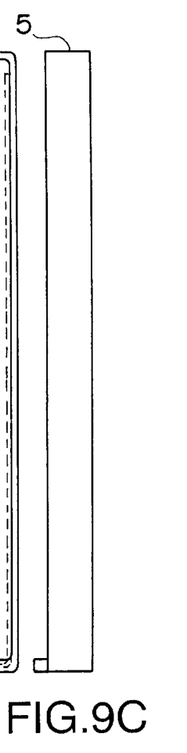
FIG. 9C is a side view of the assembly of FIG. 9A.
Figure 10A:
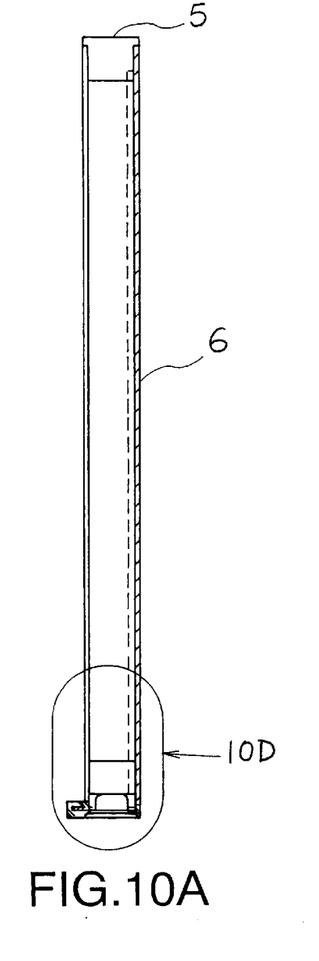
FIG. 10A it a sectional view at the line 10A—10A in FIG. 9A.
Figure 10B:
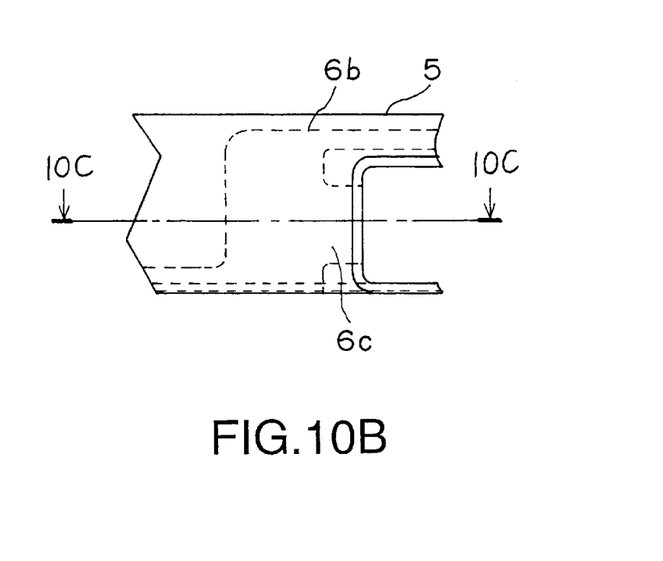
FIG. 10B is an enlarged view of a portion encircled at 10B in FIG. 9B.
Figure 10C:
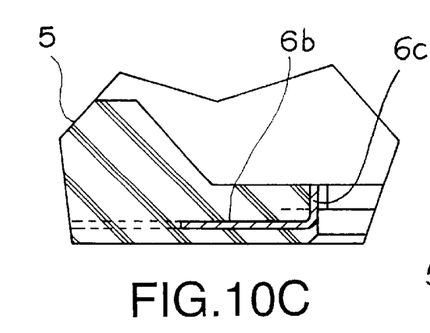
FIG. 10C is a sectional view at line 10C—10C in FIG. 10B.
Figure 10D:
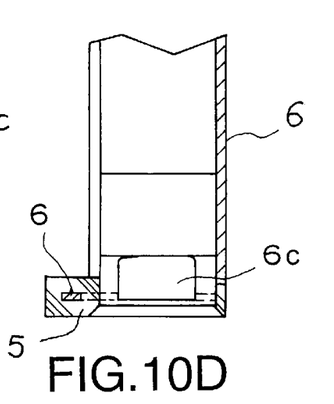
FIG. 10D is an enlarged view of a portion encircled at 10D in FIG. 10A.

FIGS. 6A and 6B show an example where the design of the structure of contact between the upper cover 6 and the bottom cover 7 of the card side I/O connector 4 and the shell 8e of the cable side I/O connector 8 has been modified. Specifically, elastic contact pieces 6a, 6a, and 7a, 7a are formed on the top cover 6 and the bottom cover 7, respectively, by the cutting and erecting work. No elastic contact piece is formed on the shell 8e. The rest is the same as the one shown in FIGS. 5A and 5B.

The structure of the top cover 6 is shown in FIGS. 7A through 7C and FIGS. 8A through 8D. In the rectangular top cover 6, a frame-shaped bent protruding section 6b is formed on the side where the card-aide I/O connector 4 is attached. The frame-shaped bent protruding section 6b is formed with an opening 5d. Lock pieces 6c and 6c are symmetrically formed inward on both sides of the bent protruding section 6b The structure of the bottom cover 7 is identical to that of the rectangular top cover 6 with the frame-shaped bent protruding section 6b being removed together with two lock pieces 6c.

The top cover 6 and the frame 5 that have been assembled are shown in FIGS. 9A through 9C and FIGS. 10A through 10D. To assemble them, the metallic top cover 6 is fabricated first, then the top cover 6 is molded integrally with the frame 5 made of a synthetic resin so that the opening 6d of the bent protruding section 6b of the top cover 6 matches the opening 5a of the frame 5.

Figure 11A:
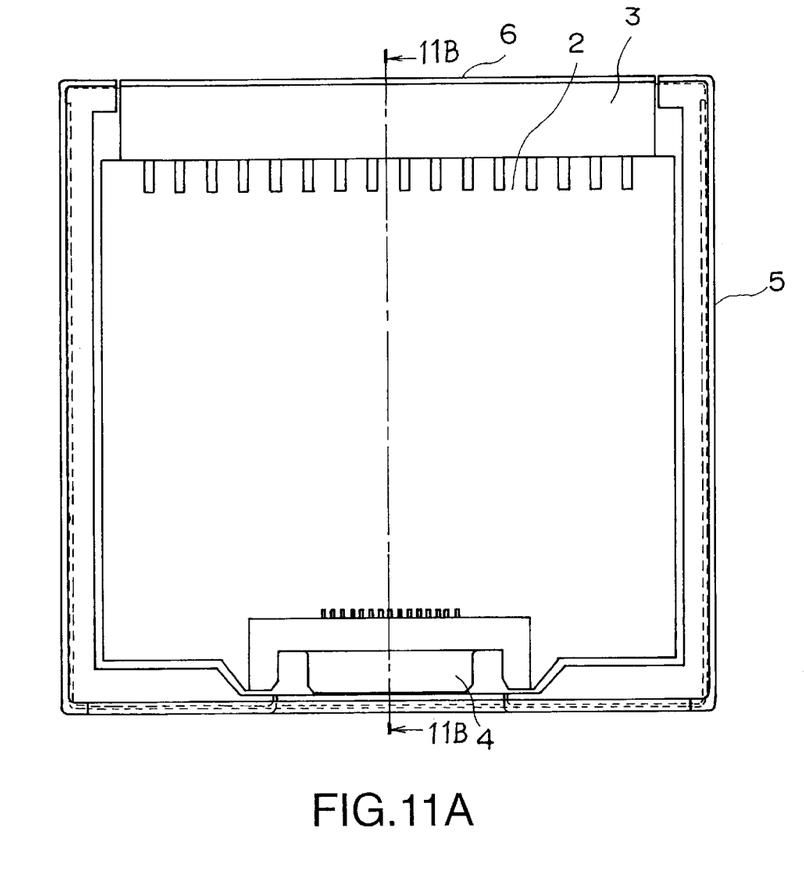
FIG. 11A is a bottom view of the I/O card of the embodiment in accordance with the present invention with a bottom cover omitted.
Figure 11B:
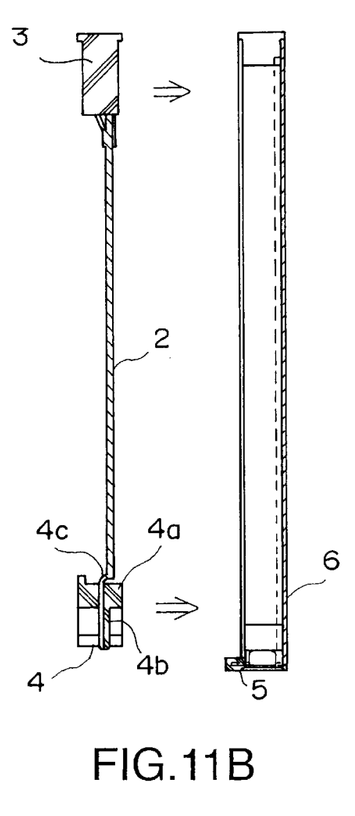
FIG. 11B is a sectional view at line 11B—11B in FIG. 11A but in an exploded condition.

The printed circuit board 2, the card side I/O connector 4, the frame 5, and the top cover 6 in the assembled state are shown in FIGS. 11A and 11B. To assemble them, the card side I/O connector 4 and chip components are mounted on the printed circuit board 2 first, then the printed circuit board 2 is installed to the frame 5 which has been integrally molded with the top cover 6. Lastly, the bottom cover 7 is fixed to the frame 5 by an adhesive agent or the like. As a result, the top cover 6 and the bottom cover 7 come in direct contact with the insulator 4a.

Mating the card side I/O connector 4 with the cable side I/O connector 8 causes the fitting section 4b of the insulator 4a and the contacts 4c to be inserted in the space 8c of the insulator 8b through the opening 5a of the frame 5 and the opening of the bent protruding section 6b, thus bringing the distal ends of the contacts 4c into contact with the distal ends of the contacts 8d. At this time, the four elastic contact pieces 8f of the shell 8e come in contact with the top cover 6 and the bottom cover 7, respectively.

In the modified example described above, the shell 8e comes in contact with the elastic contact pieces 6a of the top cover 6 and the elastic contact pieces 7a of the bottom cover 7. The two elastic locks 8g of the shell 8e are retained by the two lock pieces 6c of the top cover 6, respectively.

To separate the cable aide I/O connector 8 from the card side I/O connector 4, a hood which is made of a synthetic resin and which is not shown is used to disengage the two elastic locks 8g of the shell 8e from the two lock pieces 6c of the top cover 6, then the cable side I/O connector 8 is pulled off from the card side I/O connector 4.

As will be understood from the above description, the present invention provides the following advantages.

1. Since the card side I/O connector has no shell, a thinner I/O card can be obtained.

2. Since the card side I/O connector requires no shell, the shell assembly step can be omitted, permitting a simpler assembly process.

3. The card side I/O connector requires no shell, leading to lower cost.

4. Since the card side I/O connector is covered by the metallic top and bottom covers, the magnetic shielding effect as good as that of a shell can be obtained.

5. The card side I/O connector requires no shell, permitting easier handling when installing the connector, especially easier automated assembly.

6. The metallic covers have lock pieces engaging with the locks of the cable side I/O connector. Therefore, if a force is applied to the cable or the connectors, the force will not be applied to the contacts of the card side I/O connector, so that the connection with the printed circuit board will not be adversely affected. Furthermore, the locking strength can be improved, contributing to secure lock.

What is claimed is:

1. An I/O card comprising:

a case comprising a frame and metallic top and bottom covers mounted on top and bottom surfaces of said frame to define an inner space; and a card side I/O connector mounted in said inner space of said case a having a fitting portion exposed outside of said case for being selectively mated with a cable side I/O connector as a mating connector;

said card side I/O connector comprising;

an insulator having an upper and lower surfaces and a front surface and having said fitting portion projecting from said front surface, said insulator being fixedly disposed in said case, said upper and lower surfaces being in directly contact with said metallic top and bottom covers, respectively, said fitting portion facing said metallic top and bottom covers with spaces left therebetween; and a plurality of contacts having contact portions and fixed in said insulator, said contact portions being supported on a side of said fitting portion and facing one of said top and bottom covers with a space therebetween.

2. An I/O card as claimed in claim 1, which further comprises a printed circuit board fixedly mounted in said inner space of said case, said I/O connector is fixed and connected to said printed circuit board.

3. An I/O card as clamed in claim 2, which further comprises a system fitting connector disposed in said housing and exposed in a direction opposite to said card side I/O connector, said system fitting connector being fixed and connected to said printed circuit board.

4. An I/O card as claimed in claim 3, said cable side I/O connector having an outer metallic shell, wherein each of said top and bottom covers has an elastic contact piece extending in said spaces between said fitting portion and said top and bottom covers for coming into contact with the shell of said cable side I/O connector when said cable side I/O connector mated with said card side I/O connector.

5. An I/O card as claimed in claim 1, wherein said frame is formed integrally with one of said two covers.

6. An I/O card as claimed in claim 1, said cable side I/O connector having a pair of elastic locks, wherein one of said top and bottom covers is provided with a pair of lock pieces for engaging with said elastic locks, respectively, to lock said cable side I/O connector to said I/O card when said cable side I/O connector is mated with said card side I/O connector.

* * * * *

UNITED STATES PATENT AND TRADEMARK OFFICE
CERTIFICATE OF CORRECTION

Page 1 of 3

PATENT NO. : 6,075,705
DATED : June 13, 2000
INVENTOR(S) : Keisuke Nakamura; Kayoko Gotou It is certified that error appears in the above-identified patent and that said Letters Patent is hereby corrected as shown below:

Title page, item [57],
Abstract; Line 1, delete "In an" and insert --An--

FIGS. 5A and 5B, "I/O card 1" is not labeled

Column 1, Line 21, delete "Includes" and insert --includes--

Column 1, Line 30, delete "in" and insert --on--

Column 1, Line 32, delete "apposite" and insert --opposite--

Column 1, Line 50, after "According", insert --to--

Column 1, Line 57, delete "X/O" and insert --I/O--

Column 2, Line 17, delete "directly" and insert --direct--

Column 2, Line 38, after "mated", insert --to--

Column 2, Line 45, delete "looks" and insert --locks--

Column 3, Line 59, delete "an"

Column 3, Line 65, delete "Card" and insert --card--

Column 4, Line 22, delete "apposite" and insert --opposite--

UNITED STATES PATENT AND TRADEMARK OFFICE
CERTIFICATE OF CORRECTION

PATENT NO. : 6,075,705
DATED : June 13, 2000
INVENTOR(S) : Keisuke Nakamura; Kayoko Gotou It is certified that error appears in the above-identified patent and that said Letters Patent is hereby corrected as shown below:

Column 4, Line 24, delete "look" and insert --lock--

Column 4, Line 37, delete "look" and insert --lock--

Column 4, Line 55, delete "and" and insert --end--

Column 4, Line 62, delete "thee" and insert --thereby--

Column 4, Line 64, delete "t" and insert --time--

Column 4, Line 66, delete "looking" and insert --locking--

Column 5, Line 5, delete "looking" and insert --locking--

Column 5, Line 22, delete "protects" and insert --projects--

Column 5, Line 29, After "without", insert --a--

Column 5, Line 31, delete "apposite" and insert --opposite--

Column 5, Line 40, delete "and" and insert --end--

Column 6, Line 6, delete "card-aide" and insert --card side--

UNITED STATES PATENT AND TRADEMARK OFFICE
CERTIFICATE OF CORRECTION

PATENT NO. : 6,075,705
DATED : June 13, 2000
INVENTOR(S) : Keisuke Nakamura; Kayoko Gotou It is certified that error appears in the above-identified patent and that said Letters Patent is hereby corrected as shown below:

Column 6, Line 8, delete "5d" and insert --6d--

Column 6, Line 46, delete "aide" and insert --side--

Column 7, Line 14, delete "a" after case and insert --and--

Column 7, Line 23, delete "directly" and insert --direct--

Column 8, Line 7, delete "clamed" and insert --claimed--

Signed and Sealed this

Tenth Day of April, 2001

*Attest:*

NICHOLAS P. GODICI

*Attesting Officer*   *Acting Director of the United States Patent and Trademark Office*